(12) United States Patent
Tezuka

(10) Patent No.: US 7,463,365 B2
(45) Date of Patent: Dec. 9, 2008

(54) MEASUREMENT METHOD AND APPARATUS, EXPOSURE APPARATUS, AND DEVICE MANUFACTURING METHOD

(75) Inventor: Taro Tezuka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 11/563,453

(22) Filed: Nov. 27, 2006

(65) Prior Publication Data

US 2007/0153294 A1     Jul. 5, 2007

(30) Foreign Application Priority Data

Dec. 27, 2005   (JP)   ............... 2005-375946

(51) Int. Cl.
  *G01B 11/02* (2006.01)
  *G01B 9/02* (2006.01)
(52) U.S. Cl. ...................... 356/515; 356/521
(58) Field of Classification Search ............... 356/124, 356/499, 515, 521
See application file for complete search history.

(56) References Cited

U.S. PATENT DOCUMENTS 5,196,350 A * 3/1993 Backman et al. ............ 436/501
6,690,474 B1 * 2/2004 Shirley ...................... 356/603
2005/0046865 A1 * 3/2005 Brock et al. ................ 356/495
2005/0190378 A1 * 9/2005 Nakauchi .................... 356/515
2006/0061757 A1    3/2006 Yamamoto et al.

FOREIGN PATENT DOCUMENTS

JP   2004-273748   9/2004
JP   2005-374808   12/2005

* cited by examiner

*Primary Examiner*—Michael A Lyons
(74) *Attorney, Agent, or Firm*—Morgan & Finnegan, LLP

(57) ABSTRACT

A measurement method for measuring a wavefront aberration of a target optical system using an interference pattern formed by a light from a first image side slit, and a light from a second image side slit, the first and second image side slits being located at an image side of the target optical system, the first image side slit having, in a shorter direction, a width equal to or smaller than a diffraction limit of the target optical system, and the second image side slit having, in a shorter direction, a width greater than the diffraction limit of the target optical system includes the steps of obtaining three or more primary wavefronts of the target optical system from different measurement directions, and calculating a wavefront aberration of the target optical system based on the three or more primary wavefronts obtained by the obtaining step.

4 Claims, 13 Drawing Sheets

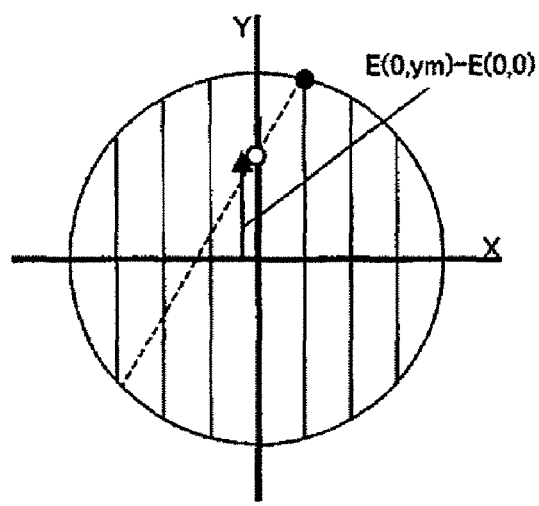
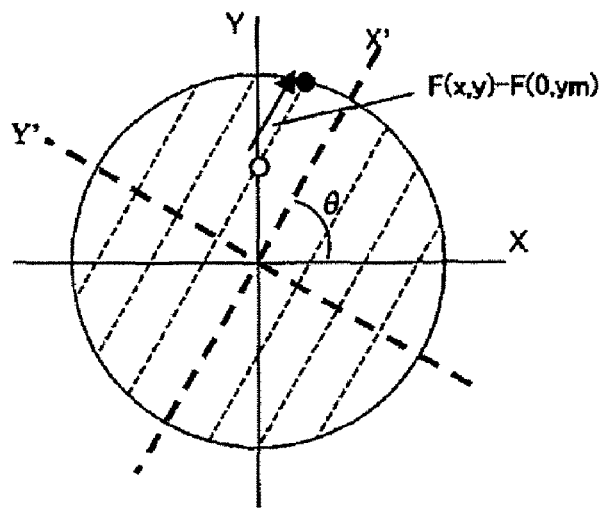
FIG. 7A  FIG. 7B
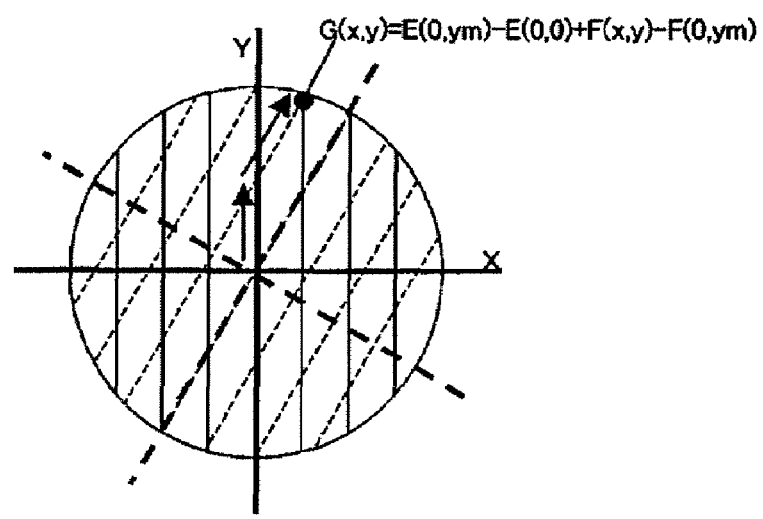
FIG. 7C

MEASUREMENT METHOD AND APPARATUS, EXPOSURE APPARATUS, AND DEVICE MANUFACTURING METHOD

BACKGROUND OF THE INVENTION

The present invention relates generally to a measurement method and apparatus, and particularly to a measurement method and apparatus for measuring an optical characteristic of a projection optical system that projects a pattern of a reticle (mask) to a substrate.

A projection exposure apparatus has so far been employed which uses the lithography technology to manufacture fine semiconductor devices such as a semiconductor device, e.g., an IC and an LSI, an imaging device, e.g., a CCD, a display device, e.g., a liquid crystal panel, a magnetic head. A projection exposure apparatus transfers a pattern of a reticle (mask) onto a substrate such a wafer via a projection optical system. Since the exposure apparatus is required to precisely transfer a pattern of a reticle to a substrate with a specified magnification, it is important to use a projection optical system that has an excellent imaging characteristic and a restrained aberration. Especially in recent years, finer processing to the semiconductor device progresses, and a pattern to be transferred has become sensitive to an aberration of an optical system. Accordingly, there is a demand to highly precisely measure a projection optical system's optical characteristic (e.g., a wavefront aberration) with the projection optical system included in an exposure apparatus. In addition, in order to improve productivity and economic efficiency, a simple, fast, and inexpensive measurement is also important.

Conventionally, a projection optical system's wavefront aberration has been measured by actually exposing a reticle pattern onto a wafer, and observing its resist image using such a means as a scanning electron microscope ("SEM"). This conventional measurement method has a problem in a poor reproducibility of measurement due to a difficult SEM operation and errors in a resist application and a development.

In order to rapidly and accurately measure a projection optical system's wavefront aberration, it is desirable to use an interference method, rather than using the conventional measurement method that exposes a pattern on a resist for evaluation. However, the conventional interference method that uses a Fizeau interferometer, a Twyman-Green interferometer, or the like makes an overall system's structure complex, thus implying a large-size and high-cost problem. Thus, it is difficult to mount the interferometer on an exposure apparatus, and the conventional interference method is not viable.

Therefore, an exposure apparatus is proposed that has a comparatively simple interferometer such as a point diffraction interferometer (hereinafter called a "PDI"), a line diffraction interferometer (hereinafter called an "LDI"), and the like. For example, see Japanese Patent Application, Publication No. 2004-273748.

The wavefront measurement using the LDI obtains a pair of primary wavefronts of the projection optical system in the measurement direction that is a direction perpendicular to a slit's longer direction, and calculates a wavefront of the projection optical system based on the pair of primary wavefronts. The "primary wavefront," as used herein, is a wavefront having wavefront aberration information of the target optical system or projection optical system only in the measurement direction.

In measuring the first and second primary wavefronts, one major error cause of the wavefront to be measured is a difference of a position in the height direction (referred to as "Z position" hereinafter) of a measurement pattern on the image side to the exposure apparatus. More specifically, this is an error of a $2\theta$ component, such as a mountain (valley) in a first measurement direction, and a valley (mountain) in a second measurement direction, in the wavefront measurement using the LDI and two primary wavefronts whose measurement directions are orthogonal to each other. Equation 1 below defines an error amount $E_{2\theta}$ of the $2\theta$ component, where dz is a Z position difference of the measurement pattern on the image side between the first and second primary wavefront measurements, $\lambda$ is a wavelength of an exposure light source, and NA is a numerical aperture of a projection optical system:

$$E_{2\theta}=dz\times(1-\mathrm{sqrt}(1-(NA)^2))/2\times\lambda) \qquad \text{EQUATION 1}$$

For example, the error amount $E_{2\theta}$ is 1.5 m$\lambda$ for dz=1 nm in the exposure apparatus having $\lambda$ of 193 nm and NA of 0.9. Control in order of several nanometers is arduous even with an apparatus mounted with a highly precise stage, such as an exposure apparatus. Conceivably, a measurement error of several m$\lambda$ or greater occurs in the wavefront measurement using the LDI, causing the error in the wavefront measurement using the LDI.

The wavefront measurement using the LDI utilizes a wavefront of the diffracted light from the slit (slit diffracted wavefront) for a reference wavefront. The manufacturing errors of the slit, such as a slit width, a thickness of a light blocking part, the parallelism in the longer direction, and the roughness of an edge cause a difference between slits for the slit diffracted wavefronts, and this difference triggers the error in the wavefront measurement using the LDI.

SUMMARY OF THE INVENTION

The present invention is directed to a measurement method that uses a simple interferometer without causing an apparatus large and expensive, and can highly precisely measure an optical characteristic or an optical characteristic of a target optical system.

A measurement method according to one aspect of the present invention for measuring a wavefront aberration of a target optical system using an interference pattern formed by a light from a first image side slit, and a light from a second image side slit, the first and second image side slits being located at an image side of the target optical system, the first image side slit having, in a shorter direction, a width equal to or smaller than a diffraction limit of the target optical system, and the second image side slit having, in a shorter direction, a width greater than the diffraction limit of the target optical system includes the steps of obtaining three or more primary wavefronts of the target optical system from different measurement directions, and calculating a wavefront aberration of the target optical system based on the three or more primary wavefronts of the target optical system obtained by said obtaining step.

A further object and other characteristics of the present invention will be made clear by the preferred embodiments described below referring to accompanying drawings.

BRIEF DESCRIPTION OF THE DRAWINGS

FIGS. 7A to 7C are views for explaining a method to obtain a wavefront information of a target optical system from two primary wavefronts with measurement directions that are different by an angle of θ, and respectively show a first primary wavefront, a second primary wavefront, and a target optical system's wavefront.

DESCRIPTION OF THE EMBODIMENTS

Figure 1:
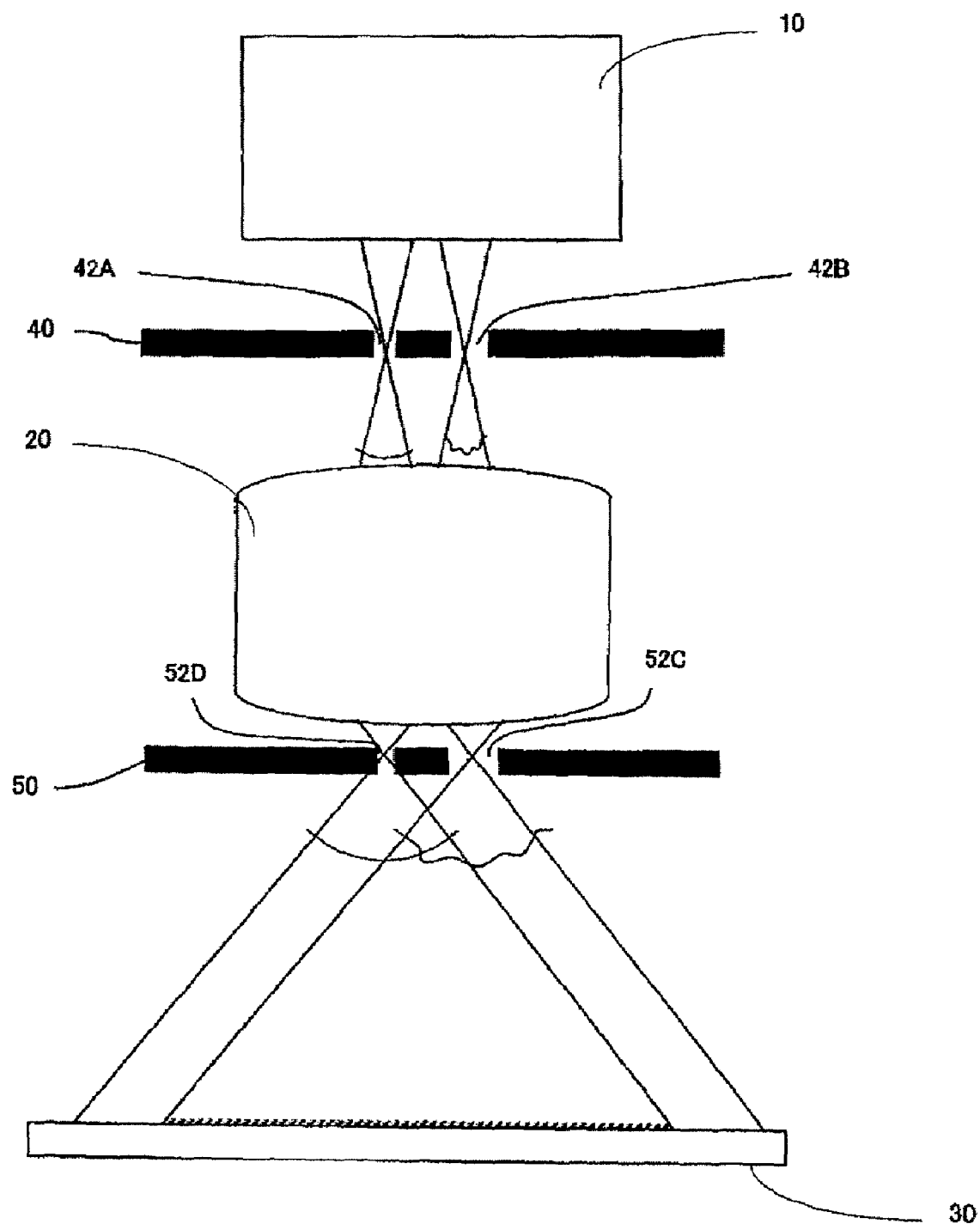
FIG. 1 is a view for explaining a principle of a wavefront measurement using an LDI.

Referring now to the accompanying drawings, a description will be given of a preferred embodiment of this invention. In each figure, the same reference numeral is assigned to the same component to avoid a duplicate explanation.

Referring to FIG. 1, a description will now be given of the principle of the wavefront measurement using the LDI. This embodiment uses a projection optical system 20 used for the exposure apparatus as an example of the target optical system.

Figures 2A, 2B:
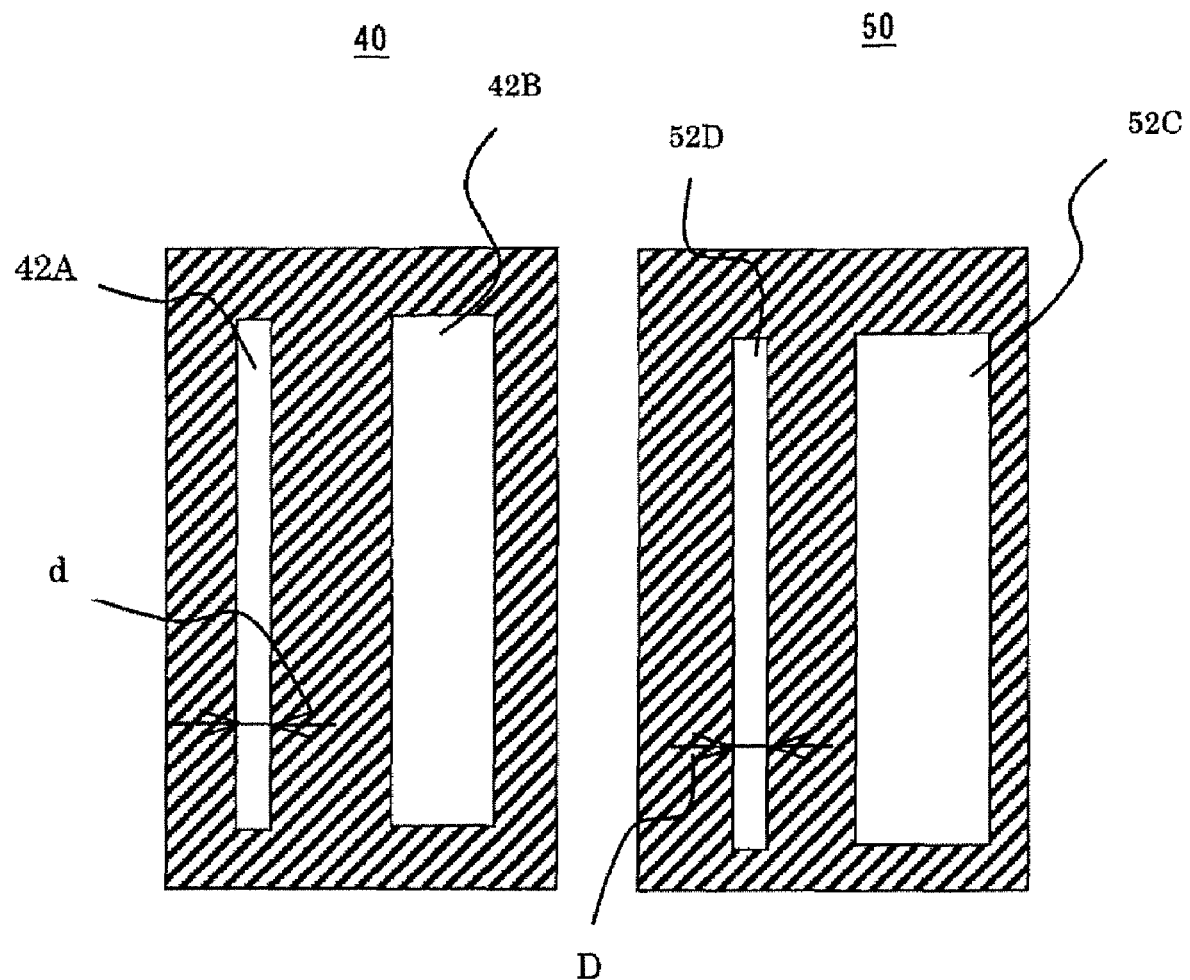
FIGS. 2A and 2B are schematic plane views showing structure of an object side measurement mark and an image side measurement mark shown in FIG. 1.

The wavefront measurement using the LDI arranges an object side measurement mark 40 having a pair of parallel adjacent slits, i.e., slit 42A and slit 42B, at an object side of a target optical system 20. A (slit) width in a shorter direction of at least one slit in the object side measurement mark 40, i.e., the slit 42A in this embodiment, is made equal to or smaller than the resolving power of the target optical system 20 at the object side. As shown in FIG. 2A, the width d of the slit 42A should preferably satisfy d≦0.5×λ/na, where na is a numerical aperture of the target optical system 20 at the object side, and λ is a wavelength. Here, FIG. 2A is a schematic plane view of the object side measurement mark 40.

If the light from an illumination optical system 10 is used to illuminate the slits 42A and 42B, the light exiting from the slit 42A has an aplanatic wavefront in the shorter direction of the slit 42A. The slit 42B may have a width equal to or wider than that of the slit 42A. When the slit 42B has a width wider than the resolving power of the target optical system 20 at the object side, the light having a wavefront influenced by the aberration of the illumination optical system 10 is emitted from the slit 42B.

A width in the longer direction of each of the slits 42A and 42B should be made narrower than the so-called isoplanatic region, in which the projection optical system 20's aberration is regarded to be identical. In addition, the slits 42A and 42B are located adjacently so that the distance between them is narrower than the isoplanatic region.

The lights exiting from the slits 42A and 42B pass the projection optical system 20, and their wavefronts are influenced by the projection optical system 20's aberration, imaging the slits 42A and 42B on the image plane of the projection optical system 20.

An image side measurement mark 50 is located on the image side of the projection optical system 20 so that a slit 52C is located at the image position of the slit 42A, and a slit 52D at the image position of the slit 42B. The slit 52D's (slit) width D in the shorter direction is set equal to or smaller than the resolving power of the projection optical system 20 on the image side. As shown in FIG. 2B, the width D of the slit 52D preferably satisfies D≦0.5×λ/NA, where NA is a numerical aperture of the projection optical system 20 on the object side, and λ is the wavelength. FIG. 2B is a schematic plane view showing the image side measurement mark 50.

A light imaged on the slit 52D has a wavefront affected by an aberration of the projection optical system 20 and also affected by an aberration of an illumination optical system 10 depending on the width of the slit 42B. However, when passing through the slit 52D it has an aplanatic wavefront in the shorter direction of the slit 52D.

On the other hand, the (slit) width of the slit 52C in the shorter direction is set sufficiently greater than the diffraction limit of the projection optical system 20 or is preferably about ten to hundred times as wide as the wavelength. The light imaged on the slit 52C has a wavefront affected only by the aberration of the projection optical system 20 in the shorter direction of the slit 52C. Since the slit (window) width of the slit 52C is sufficiently wide, the emitted light has a wavefront affected only by the aberration of the projection optical system 20.

The lights from the slits 52C and 52D interfere with each other, forming an interference pattern. By detecting the interference pattern using a image sensor 30 such as a CCD, a first primary wavefront of the projection optical system 20 is acquired with a correct relative relationship in a measurement direction perpendicular to the longer direction of the slit. The "primary wavefront," as used herein, is a wavefront having wavefront aberration information of the target optical system or projection optical system 20 only in the measurement direction.

Figure 3A:
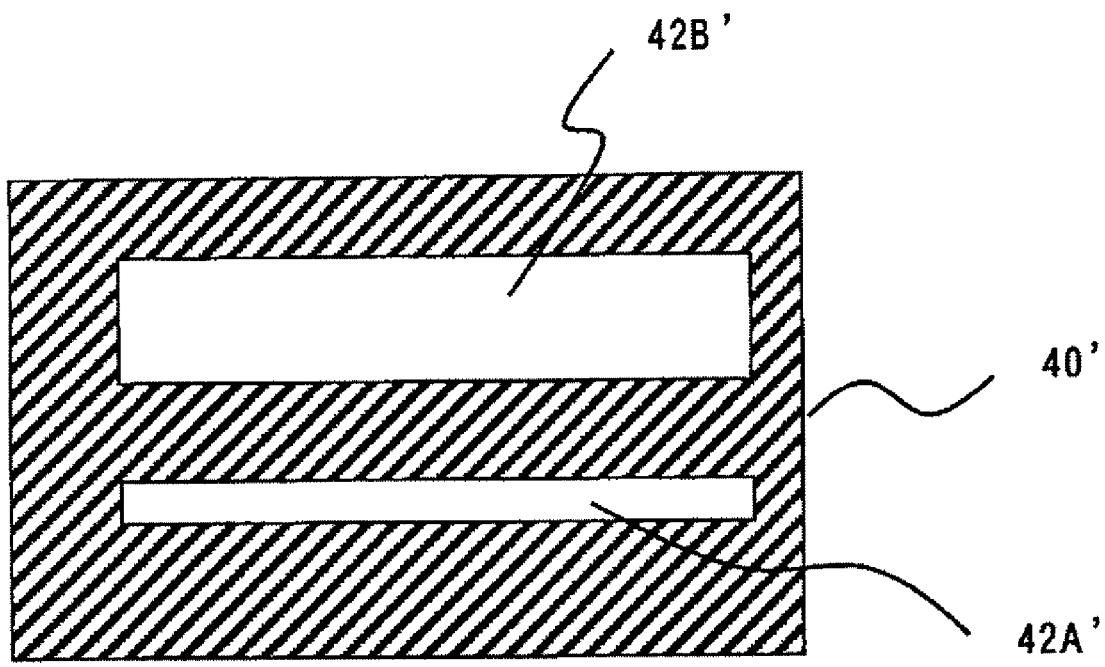
FIGS. 3A and 3B are schematic plane views showing an object side measurement mark and an image side measurement mark which have slits in a direction orthogonal to the slits of the object side measurement mark shown in FIG. 2A and the image side measurement mark shown in FIG. 2B.
Figure 3B:
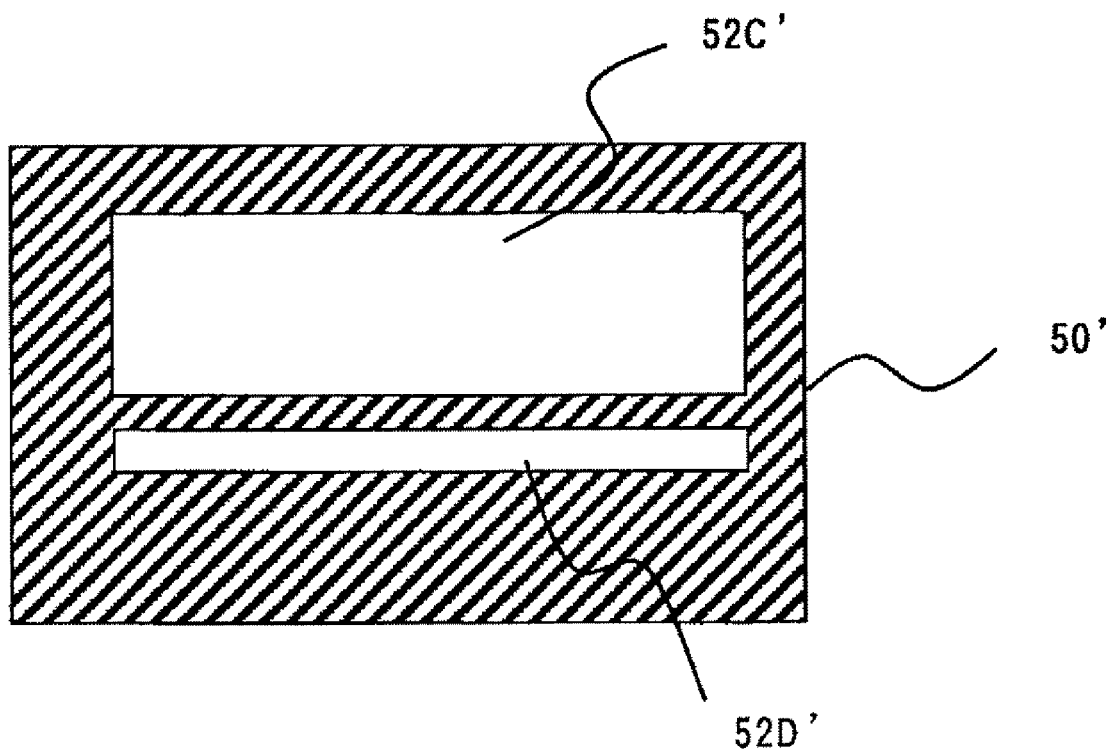

As shown in FIGS. 3A and 3B, object side measurement marks 40' and 50' having slits 42A', 42B', 52C', and 52D' in a direction orthogonal to the slits 42A, 42B, 52C and 52D are used to similarly obtain a second primary wavefront. FIG. 3A is a schematic plane view showing the object side measurement mark 40' having the slits in the direction orthogonal to the slits of the object side measurement mark 40. FIG. 3B is a schematic plane view showing the image side measurement mark 50' having the slits in the direction orthogonal to the slits of the image side measurement mark 50.

The wavefront of the projection optical system 20 can be obtained from phase information in two measurement directions using a pair of primary wavefronts, i.e., the first and second primary wavefronts.

Figure 4A:
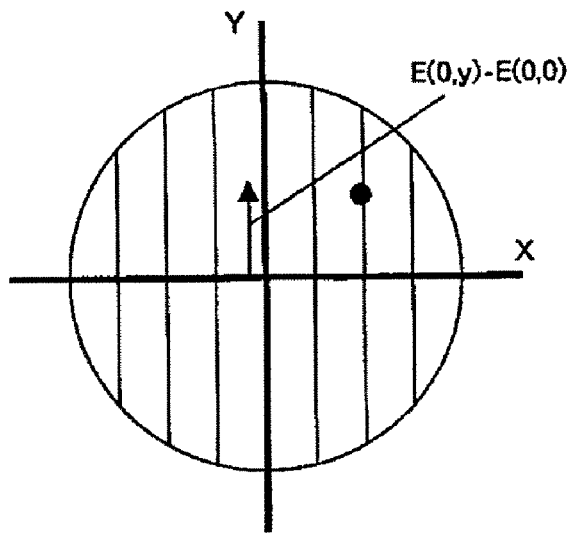
FIGS. 4A to 4C are views for explaining a method to obtain a wavefront information of a target optical system from two primary wavefronts, and respectively show a first primary wavefront, a second primary wavefront, and a target optical system's wavefront.
Figure 4B:
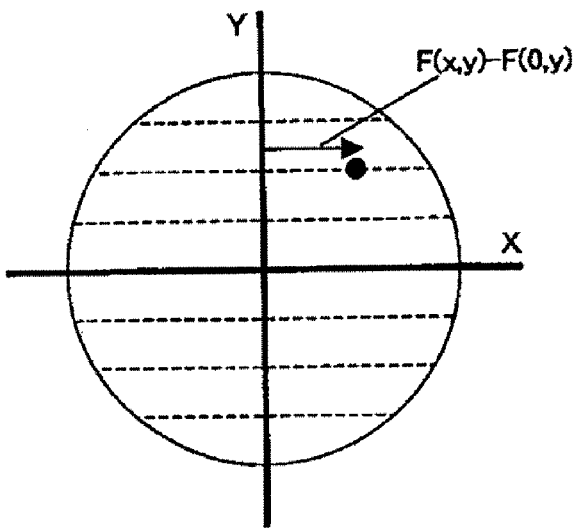
Figure 4C:
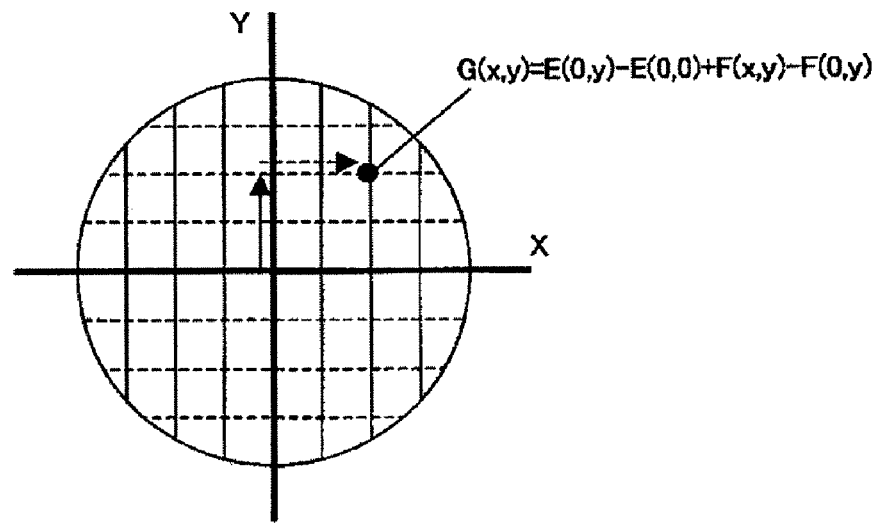

Referring now to FIGS. 4A to 4C, a description will be given of a method for obtaining wavefront information of the projection optical system 20 from two primary wavefronts. FIGS. 4A, 4B, and 4C show a first primary wavefront, a second primary wavefront, and a projection optical system 20's wavefront, respectively. The phaseal relationship in FIG. 4A on a line parallel to the Y-axis is equal to the phaseal relationship on the same line in FIG. 4C. The phaseal relationship in FIG. 4B on a line parallel to the X-axis is equal to the phaseal relationship on the same line in FIG. 4C. From these relative relationships, the phase of an arbitrary point G (x, y) on a wavefront of the projection optical system 20 shown FIG. 4C is calculated as phase change amounts E(0, y)−E(0, 0) and F(x, y)−F(0, y) along the arrows in FIG. 4C, and expressed in the following equation:

$$G(x,y)=E(0,y)-E(0,0)+F(x,y)-F(0,y) \quad \text{EQUATION 2}$$

The wavefront of the projection optical system 20 shown in FIG. 4C can be thus obtained from two primary wavefronts shown in FIGS. 4A and 4B. However, as mentioned above, the thus obtained wavefront of the projection optical system 20 contains a measurement error due to an error of the Z position and manufacturing errors of the slits.

Accordingly, the measurement method and apparatus of this embodiment averages the measured wavefronts, and reduces the measurement error due to the error of the Z position of the measurement pattern and manufacturing errors of the slits in the image side measurement marks.

Figure 5:
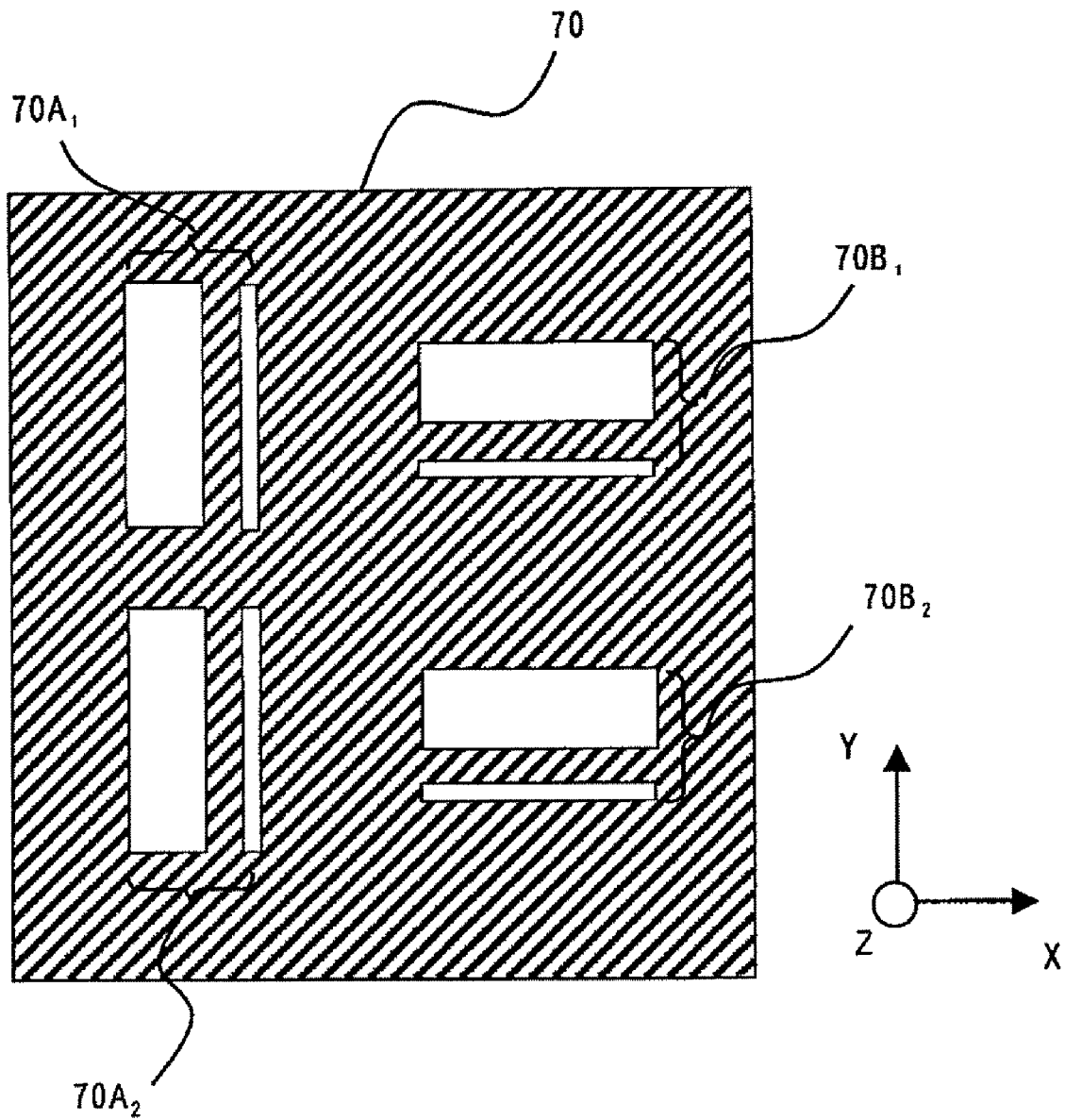
FIG. 5 is a schematic plane view of an image side measurement mark having slits arranged in two directions.

FIG. 5 is a schematic plane view showing an image side measurement mark 70 having slits $70A_1$, $70A_2$, $70B_1$, and $70B_2$ arranged in two directions or having two measurement directions, as in the prior art. In other words, the image side measurement mark 70 incorporates the slits 52C and 52D shown in FIG. 2B with the slits 52C' and 52D' shown in FIG. 3B.

Referring now to FIG. 5, a description will be given of the number of wavefronts calculated from n primary wavefronts. Assume three primary wavefronts $W1(70A_1)$, $W1(70A_2)$, and $W1(70B_1)$ obtained from the slits $70A_1$, $70A_2$, and $70B_1$ for n=3. In this case, the calculated wavefronts are $W(70A_1, 70B_1)$ and $W(70A_2, 70B_1)$, and the number of wavefronts $N_{d2}$ is 2. Similarly, when n is an odd number, the number of wavefronts $N_{dn}$ calculated from n primary wavefronts is defined as $((n-1)/2)\times((n+1)/2)$ as expressed below:

$$N_{d2}=(n^2-1)/4 \ (n: \text{odd number}) \quad \text{EQUATION 3}$$

Assume four primary wavefronts $W1(70A_1)$, $W1(70A_2)$, $W1(70B_1)$, and $W1(70B_2)$ obtained from the slits $70A_1$, $70A_2$, $70B_1$, and $70B_2$ for n=4. In this case, the calculated wavefronts are $W(70A_1, 70B_1)$, $W(70A_1, 70B_2)$, $W(70A_2, 70B_1)$ and $W(70A_2, 70B_2)$ and thus the number of wavefronts $N_{d2}$ is 4 Similarly, when n is an even number, the number of wavefronts $N_{dn}$ calculated from n primary wavefronts is defined as $(n/2)^2$ as expressed below:

$$N_{d2}=n^2/4(n: \text{even number}) \quad \text{EQUATION 4}$$

Figure 6:
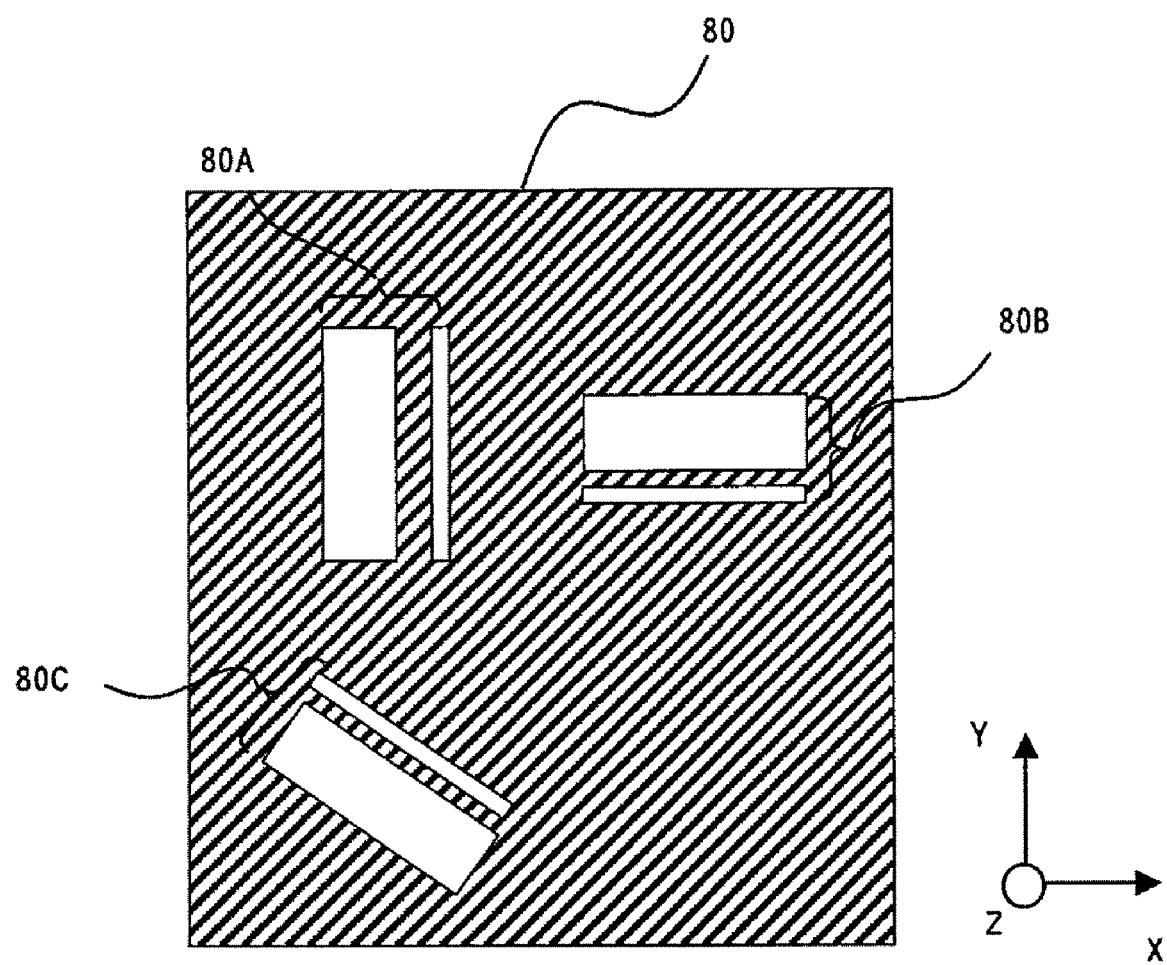
FIG. 6 is a schematic plane view of an image side measurement mark having slits arranged in three directions.

FIG. 6 is a schematic plane view of the image side measurement mark 80 having slits 80A, 80B, and 80C arranged in three directions or having three measurement directions. Referring to FIG. 6, a description will be given of the number of wavefronts calculated from n primary wavefronts for n measurement directions.

Assume three primary wavefronts $W1(80A)$, $W1(80B)$, and $W1(80C)$ obtained from the slits 80A, 80B, and 80C for n=3. In this case, the calculated wavefronts are $W(80A, 80B)$, $W(80A, 80C)$, and $W(80B, 80C)$, and thus the number of wavefronts $N_{d3}$ is 3. Similarly, when n is an odd number, the number of wavefronts $N_{dn}$ calculated from n primary wavefronts is defined as (n−1)+(n−2)+ . . . 1 as expressed below:

$$N_{dn}=n(n-1)/2 \ (n: \text{integer}) \quad \text{EQUATION 5}$$

For n>2, $N_{dn}$>$N_{d2}$. The number of wavefronts for three or more measurement directions calculated from the same number of primary wavefronts is more than that for two measurement directions. This configuration can increase the number of averaging operations for the same number of measurements, and effectively reduce a measurement error due to the Z position error and manufacturing errors of the slits.

Although the wavefront measurement using the LDI and primary wavefronts obtained from two orthogonal measurement directions is well-known, two measurement directions do not have to be orthogonal to each other. Referring now to FIG. 7B, a description will be given of a method of obtaining the wavefront information of the target optical system from two primary wavefronts when the measurement directions are different by an angle of θ. FIGS. 7A, 7B, and 7C respectively show the first primary wavefront, the second primary wavefront, and the wavefronts of the target optical system. The phaseal relationship in FIG. 7A on a line parallel to the Y-axis is equal to the phaseal relationship on the same line in FIG. 7C. The phaseal relationship in FIG. 7B on a line parallel to the X'-axis is equal to the phaseal relationship on the same line in FIG. 7C. From these relative relationships, the phase of an arbitrary point G (x, y) on a wavefront of the target optical system shown FIG. 7C is calculated as phase change amounts E(0, ym)−E(0, 0) and F(x, y)−F(0, ym) along the arrows in FIG. 7C, and expressed in the following equation:

$$G(x,y)=E(0,ym)-E(0,0)+F(x,y)-F(0,ym) \quad \text{EQUATION 6}$$

The wavefront of the target optical system shown in FIG. 4C can be thus obtained from two primary wavefronts shown in FIGS. 7A and 7B. Here, ym is a Y coordinate of an intersection between the Y-axis and a line parallel to the X'-axis that passes a point (x, y), and expressed as follows:

$$ym=y-x\tan\theta \quad \text{EQUATION 7}$$

While this embodiment uses the image side measurement mark 80 having the slits 80A, 80B, and 80C arranged in three directions to obtain the primary wavefronts in three or more measurement directions, the slits do not have to be arranged in three directions. For example, the primary wavefronts in three or more measurements directions may be obtained by rotating the image side measurement mark.

Figure 8:
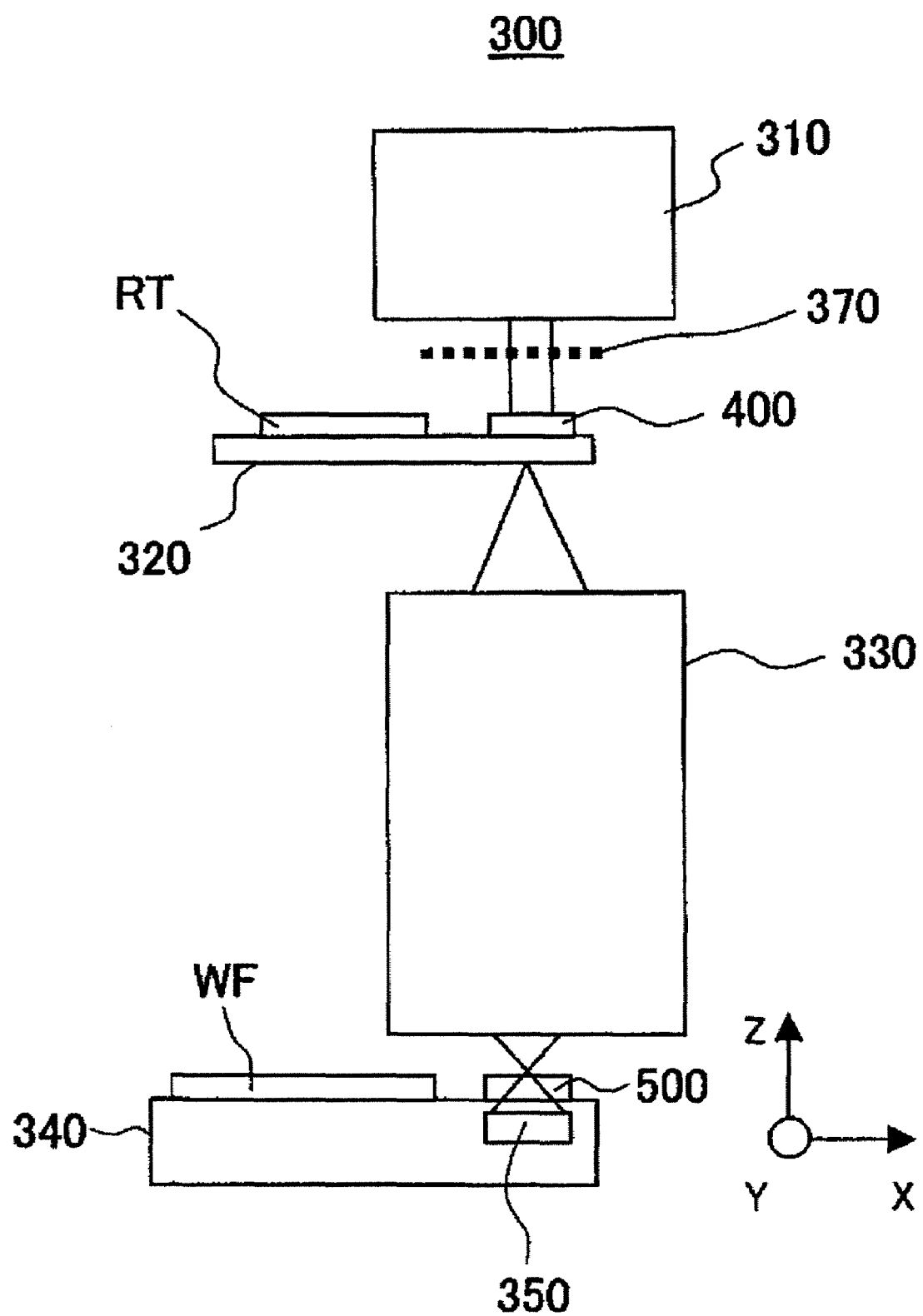
FIG. 8 is a schematic sectional view showing a structure of an exposure apparatus according to one aspect of this invention.

A description will now be given of an exposure apparatus to which a measurement method and apparatus of this embodiment are applied. FIG. 8 is a schematic sectional view showing the structure of an exposure apparatus 300 according to one aspect of this invention. The exposure apparatus 300 includes an illumination apparatus 310, a reticle stage 320 on which to locate a reticle RT, a projection optical system 330, and a wafer stage 340 on which to locate a wafer WF. The exposure apparatus further includes a image sensor 350, an object side measurement mark 400, and an image side measurement mark 500, which constitute a measurement apparatus (interferometer).

The exposure apparatus 300 is a projection exposure apparatus that exposes a circuit pattern of a reticle RT onto a wafer WF in a step-and-scan manner. The exposure apparatus 300 may use a step-and-repeat manner. In this embodiment, a description will be given below of a step-and-scan exposure apparatus as an example.

The illumination apparatus 310, which illuminates the reticle RT on which a circuit pattern to be transferred is formed, includes a light source section (not shown), and an illumination optical system (not shown). The illumination apparatus 310 illuminates the object side measurement mark 400, which will be described later.

The light source section can use as a light source, for example, an ArF excimer laser with a wavelength of about 193 nm, a KrF excimer laser with a wavelength of about 248 nm, and the like, and the number of lasers is not limited. The kind of a light source is not limited to the excimer laser, and an $F_2$ laser with a wavelength of about 157 nm may be used.

The illumination optical system 14 is an optical system that illuminates the reticle RT and the object side measurement mark 400.

The reticle RT is made, for example, of quartz, on which a circuit pattern to be transferred is formed, and is supported and driven by the reticle stage 320. The diffracted lights from the reticle RT pass the projection optical system 330, and are projected onto the wafer WF. The reticle RT and the wafer WF are located in an optically conjugate relationship. The exposure apparatus 300 is of a step-and-scan type, and a pattern on the reticle RT is transferred onto the wafer WF when the reticle RT and the wafer WF are scanned at a speed ratio of the reduction ratio.

The reticle stage 320 supports the reticle RT and the object side measurement mark 400 via a reticle chuck (not shown), and is connected to a transport mechanism (not shown). The transport mechanism (not shown) includes a linear motor etc., and drives the reticle stage 320 in the X-axis direction, thus moving the reticle RT and the object side measurement mark 400.

The projection optical system 330 serves to image, onto the wafer WF, the diffracted lights that have passed a pattern of the reticle RT. The projection optical system 330 may use a dioptric system solely including a plurality of lens elements, a catadioptric system including a plurality of lens elements and at least one concave mirror, etc.

The wafer WF is supported and driven by the wafer stage 340. A substrate to be exposed is the wafer WF in this embodiment, but may cover a wide range of substrates such as a glass plate and other processed objects. A photoresist is applied to the wafer WF.

The wafer stage 340 supports the wafer WF and the image side measurement mark 500. The wafer stage 340 can use a linear motor, for example, to move the wafer WF in the XY directions. The reticle RT and the wafer WF are synchronously scanned, for example, and a laser interferometer, etc. monitors positions of the wafer stage 340 and the reticle stage 320. The wafer stage 340 and the reticle stage 320 are moved at a constant speed ratio.

A description will now be given of a measurement apparatus or an interferometer that measures a wavefront aberration of the projection optical system 330. As described above, this apparatus includes the image sensor 350, the object side measurement mark 400, and the image side measurement mark 500. The exposure light emitted from the illumination apparatus 310 is utilized for the light for illuminating the object side measurement mark 400.

Figure 9:
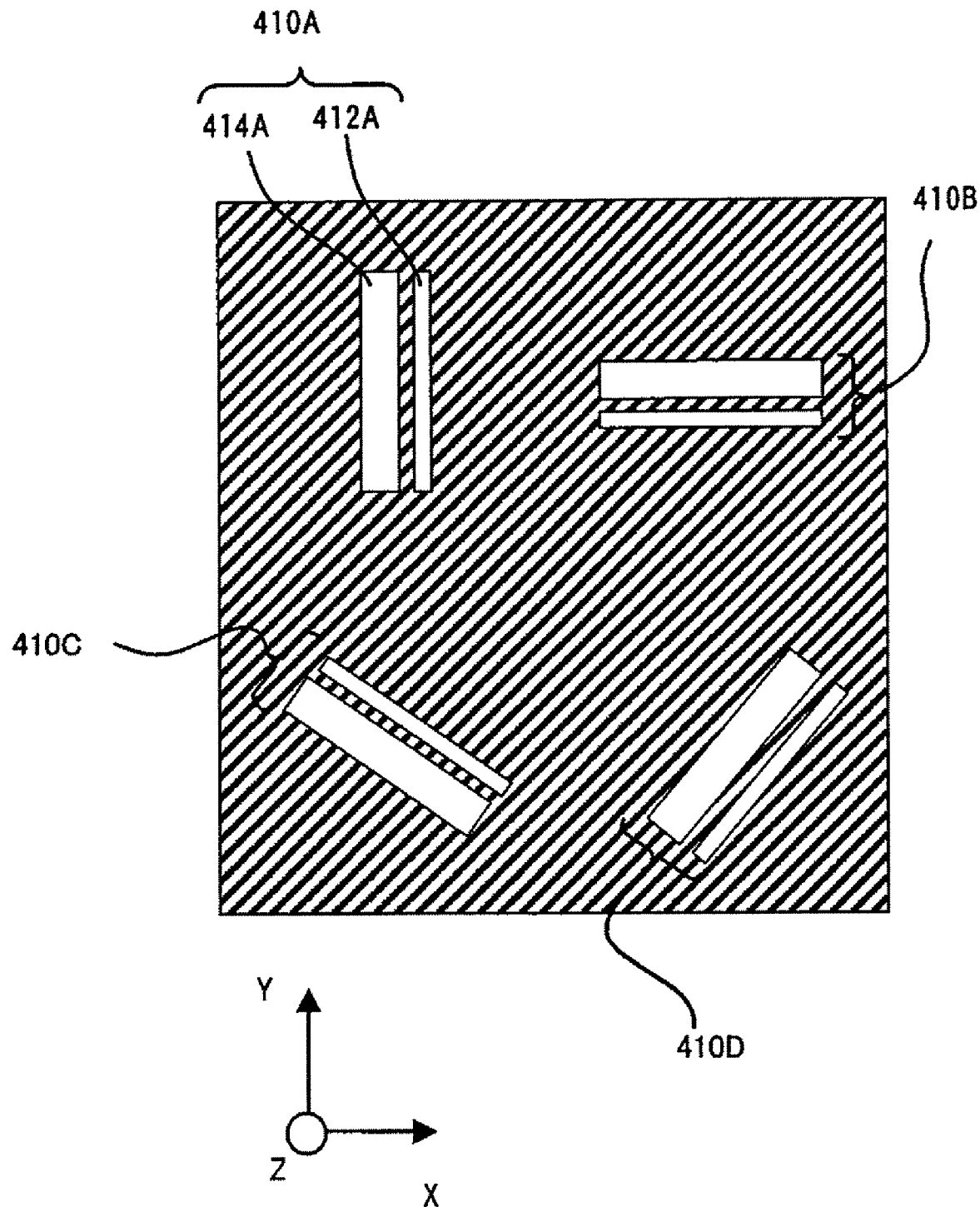
FIG. 9 is a schematic plane view of an object side measurement mark provided on a reticle stage shown in FIG. 8.
Figure 10:
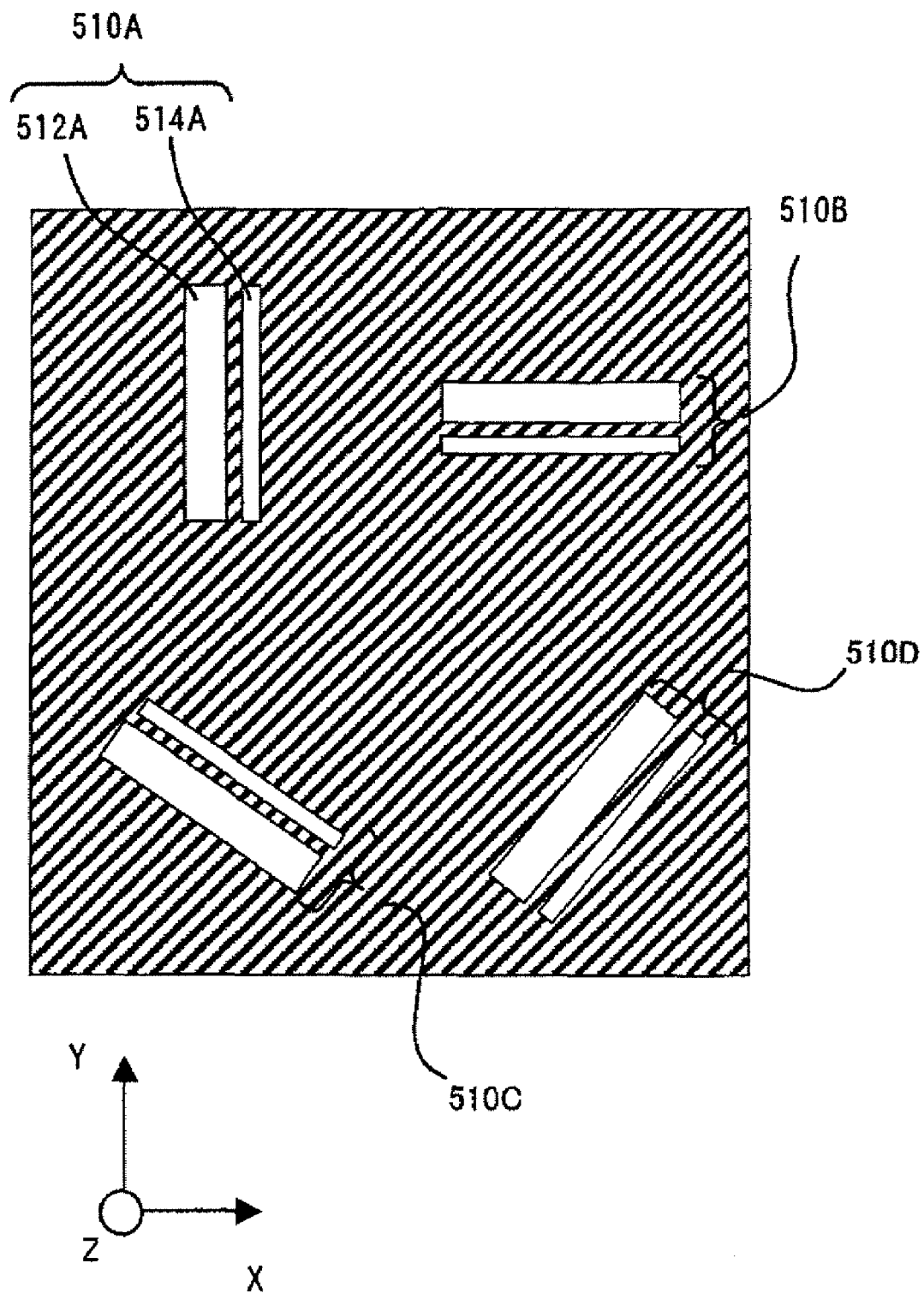
FIG. 10 is a schematic plane view of an image side measurement mark provided on a wafer stage shown in FIG. 8.

FIG. 9 is a schematic plane view showing a structure of the object side measurement mark 400 located on the reticle stage 320. FIG. 10 is a schematic plane view showing a structure of the image side measurement mark 500 located on the wafer stage 340. The image and object side measurement marks 400 and 500 have measurement patterns for measuring the primary wavefronts in three or more measuring directions, e.g., four measurement directions in this embodiment. The coordinate system is set to that of the projection optical system 330 such that the Z-axis is the up-and-down direction of the exposure apparatus 300, the Y-axis is the direction perpendicular to the paper plane, and the X-axis is the direction orthogonal to the Z-axis and Y-axis. Then, on the XY plane of the projection optical system 330, this embodiment can measure the primary wavefronts in the measurement directions that have angles of 0°, 45°, 90°, and 135° from the X-axis.

The object side measurement mark 400 has a first measurement pattern 410A, a second measurement pattern 410B, a third measurement pattern 410C, and a fourth measurement pattern 410D. The image side measurement mark 500 has a first measurement pattern 510A, a second measurement pattern 510B, a third measurement pattern 510C, and a fourth measurement pattern 510D.

The first measurement pattern 410A has a pair of slits 412A and 414A for a measurement direction, for example, of 0°. The (slit) width d of the slit 412A in its shorter direction is set to about $d=0.5\times\lambda/na$, where na is a numerical aperture of the projection optical system 330 on the object side, and $\lambda$ is the wavelength of the exposure light from the illumination apparatus 310. The (slit) width of the slit 414A in its shorter direction is equal to or wider than that of the slit 412A in its short direction.

An image of the first measurement pattern 410A is formed onto the first measurement pattern 510A of the image side measurement mark 500 via the projection optical system 330. The first measurement pattern 510A has a pair of slits 512A and 514A. The slit 512A has a (slit) width in its shorter direction substantially greater than the diffraction limit of the projection optical system 330. The (slit) width D of the slit 514A in its shorter direction D is set to about $D=0.5\times\lambda/NA$, where NA is the numerical aperture of the projection optical system 330 on the image side, and $\lambda$ is the wavelength of the exposure light from the illumination apparatus 310.

Two lights that have passed the first measurement pattern 510A interfere with each other, and form an interference pattern. This interference pattern is taken by the image sensor 350 on the wafer stage 340, providing the first primary wavefront of the projection optical system 330.

Subsequently, the reticle stage 320 is moved or the illumination optical system's illumination area is changed, and the second measurement pattern 410B (having the measurement direction of 90°) orthogonal to the first measurement pattern 410A of the object side measurement mark 400 is illuminated. Thereby, an image of the second measurement pattern 410B is formed on the second measurement pattern 510B of the image side measurement mark 500 via the projection optical system 330, thus providing the second primary wavefront of the projection optical system 330, similar to the first measurement pattern 410A.

The first primary wavefront W(0°) of the projection optical system 330 is obtained from these two primary wavefronts, i.e., the first and second primary wavefronts.

Similar to the first primary wavefront W(0°), the second primary wavefront W(45°) is obtained. More specifically, this measurement uses the third measurement pattern 410C having the measurement direction of 45° and the fourth measurement pattern 410D orthogonal to it in the object side measurement mark 400, and the third and fourth measurement patterns 510C and 510D in the image side measurement mark 500. The fourth measurement patterns 410D and 510D have the measurement direction of 135°.

In changing the illumination area of the illumination optical system to illuminate the first measurement pattern 410A to the fourth measurement pattern 410B so as to obtain the second primary wavefront W(45°) of the projection optical system 330, the first measurement pattern 410A to the fourth measurement pattern 410B are located in the isoplanatic region.

In order to avoid a spherical aberration of a transparent plate having a measurement pattern, the object side measurement mark 400 and the image side measurement mark 500 are drawn on the side of the projection optical system 30 of the transparent plate. If the illumination optical system has poor spatial coherence, a grating 370 may be inserted above the object side measurement mark 400 so as to illuminate the measurement pattern (aperture) of the object side measurement mark 400 with an arbitrary order diffracted light.

The final wavefront of the projection optical system 300 is calculated by taking the 2θ component from each of the first primary wavefront W(0°) and the second primary wavefront W(45°) of the projection optical system 330. More specifically, the final wavefront of the projection optical system 300 is determined by using a value of the first primary wavefront W(0°) for the sin2θ component, and by using an average of the first primary wavefront W(0°) and the second primary wavefront W(45°) for the other components.

As described above, the cos2θ component of the first primary wavefront W(0°) of the projection optical system 330 is a Z position difference between the first measurement pattern 410A (or 510A) and the second measurement pattern 410B (or 510B). The sin2θ component of the second primary wavefront W(45°) of the projection optical system 330 is a Z position difference between the third measurement pattern 410C (or 510C) and the fourth measurement pattern 410D (or 510D). This is because the measurement directions of the first and second measurement patterns incline by 45° to the X-axis and Y-axis of the projection optical system 330.

Since the cos2θ component is orthogonal to the sin2θ component, the Z position error in measuring the first primary wavefront W(0°) of the projection optical system 330 does not affect the sin2θ component of the first primary wavefront W(0°). Similarly, the Z position error in measuring the second primary wavefront W(45°) of the projection optical system 330 does not affect the cos2θ component of the second primary wavefront W(45°). Thus, the obtained wavefront of the projection optical system 330 is not affected by the Z position error of the measurement pattern.

The exposure apparatus 300 thus uses the simple measurement apparatus (i.e., an object side measurement mark 400, an image side measurement mark 500, and a image sensor 350), and acquires precise aberration information or wavefront aberration over the pupil area in the projection optical system 330 that serves as a target optical system.

In addition, the projection optical system 330 has a correction optical system (not shown) that corrects the aberration of the projection optical system 330 by feeding back the measured wavefront aberration to the projection optical system 330. The correction optical system makes multiple optical elements (not shown) movable in and orthogonal to the optical-axis direction, and drives one or more optical elements based on the aberration information obtained by this embodiment. Thereby, it is possible to correct or optimize the wavefront aberration of the projection optical system 330. The adjusting mechanism of the aberration of the projection optical system 330 can use various known systems, in addition to the movable lens, such as a movable mirror (for a catadioptric or catoptric system), an inclinable plane-parallel plate, a pressure controllable space, an actuator-operated plane correction, and so on.

Figure 11:
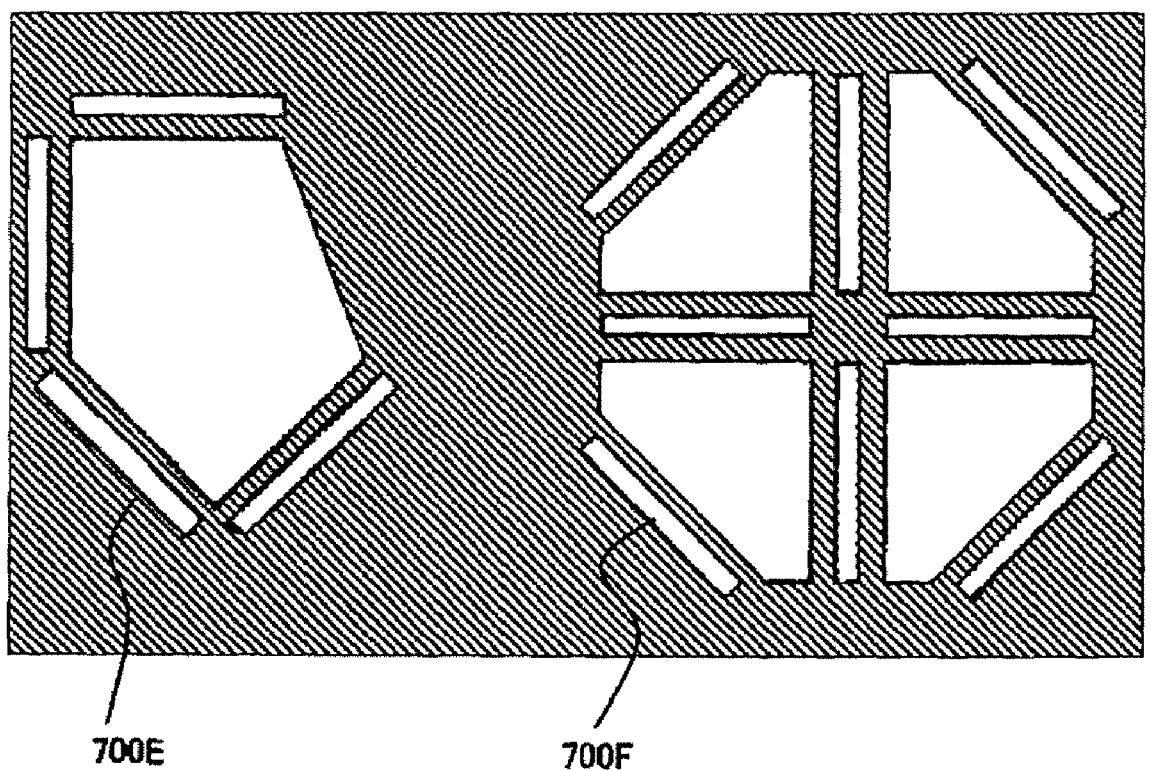
FIG. 11 is a schematic plane view showing an image side measurement mark replaceable with that shown in FIG. 10.

The image side measurement mark 500 may be replaced with an image side measurement mark 700 shown in FIG. 11. The image side measurement mark 700 shown in FIG. 11 is different from image side measurement mark 500 in an arrangement of the measurement pattern. FIG. 11 is a schematic plane view of the image side measurement mark 700.

Each of the measurement patterns 700E and 700F of the image side measurement mark 700 has a united structure of the four measurement patterns or four measurement directions of the image side measurement marks 500. In other words, the measurement patterns 700E and 700F share the slit or window of the measurement patterns 510A to 510D in the image side measurement mark 500.

The image side measurement mark 700 has measurement patterns in which each measurement direction is closely arranged. Therefore, the image side measurement mark 700 can make the moving direction of the wafer stage 340 shorter than that for the image side measurement mark, such as the image side measurement mark 500, that does not share a slit or measurement pattern. Thereby, the image side measurement mark 700 can reduce the Z position error caused by the movement of the wafer stage 340.

In exposure, the light emitted from the light source section (not shown), for example, Koehler-illuminates the reticle RT through the illumination optical system (not shown). The lights which have passed the reticle RT and reflect a reticle pattern are imaged on the wafer WF by the projection optical system 330. As described above, the projection optical system 330 in the exposure apparatus 300 has a well-corrected aberration, and achieves an excellent imaging characteristic. Accordingly, the exposure apparatus 300 can provide high-definition devices (semiconductor devices, LCD devices, imaging devices (such as CCD, etc.), thin-film magnetic heads) with high throughput and economical efficiency. The simple measurement apparatus measures the wavefront aberration of the projection optical system 330 without increasing a size and the cost of an apparatus.

Figure 12:
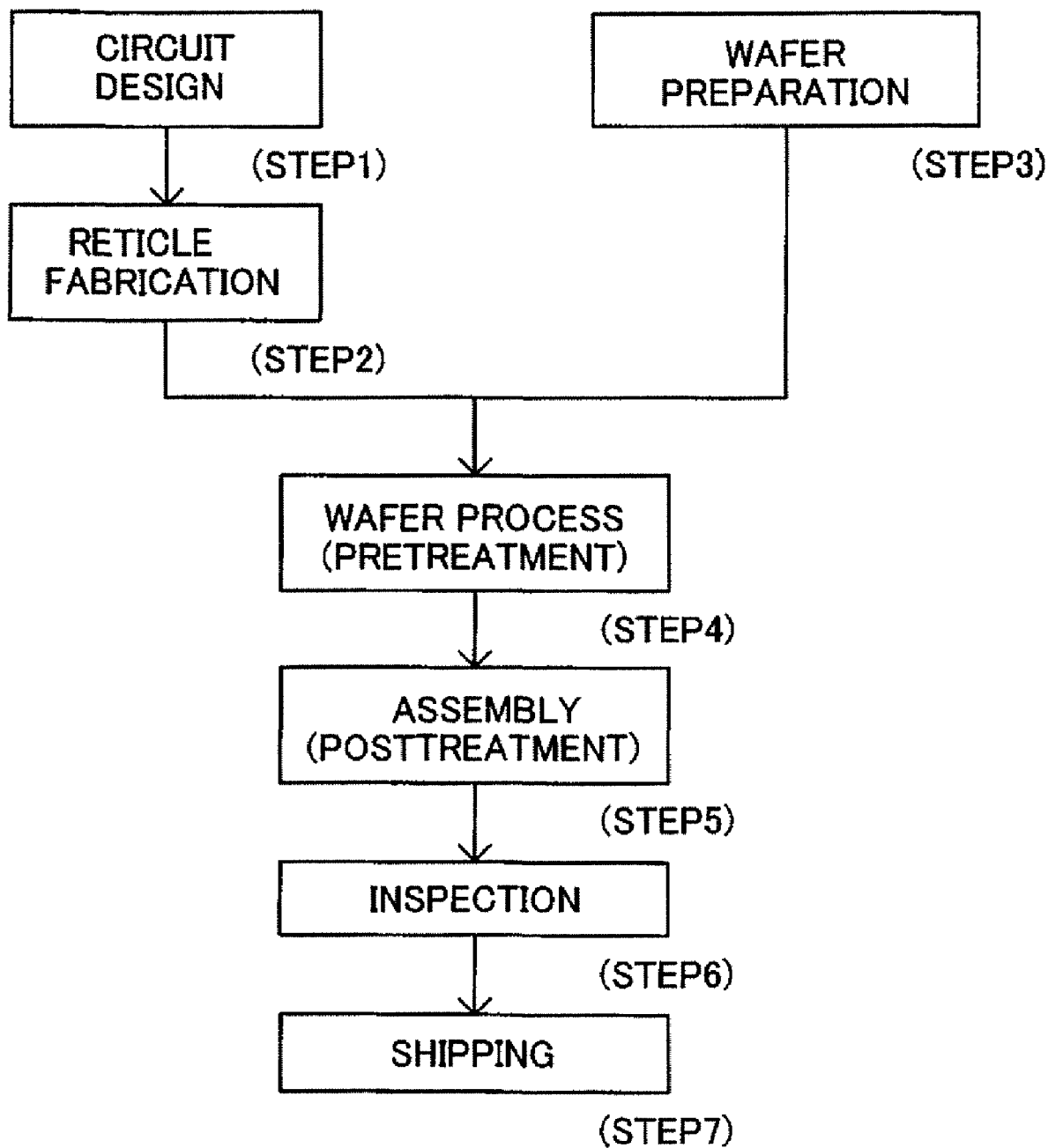
FIG. 12 is a flowchart for explaining fabrication of devices.
Figure 13:
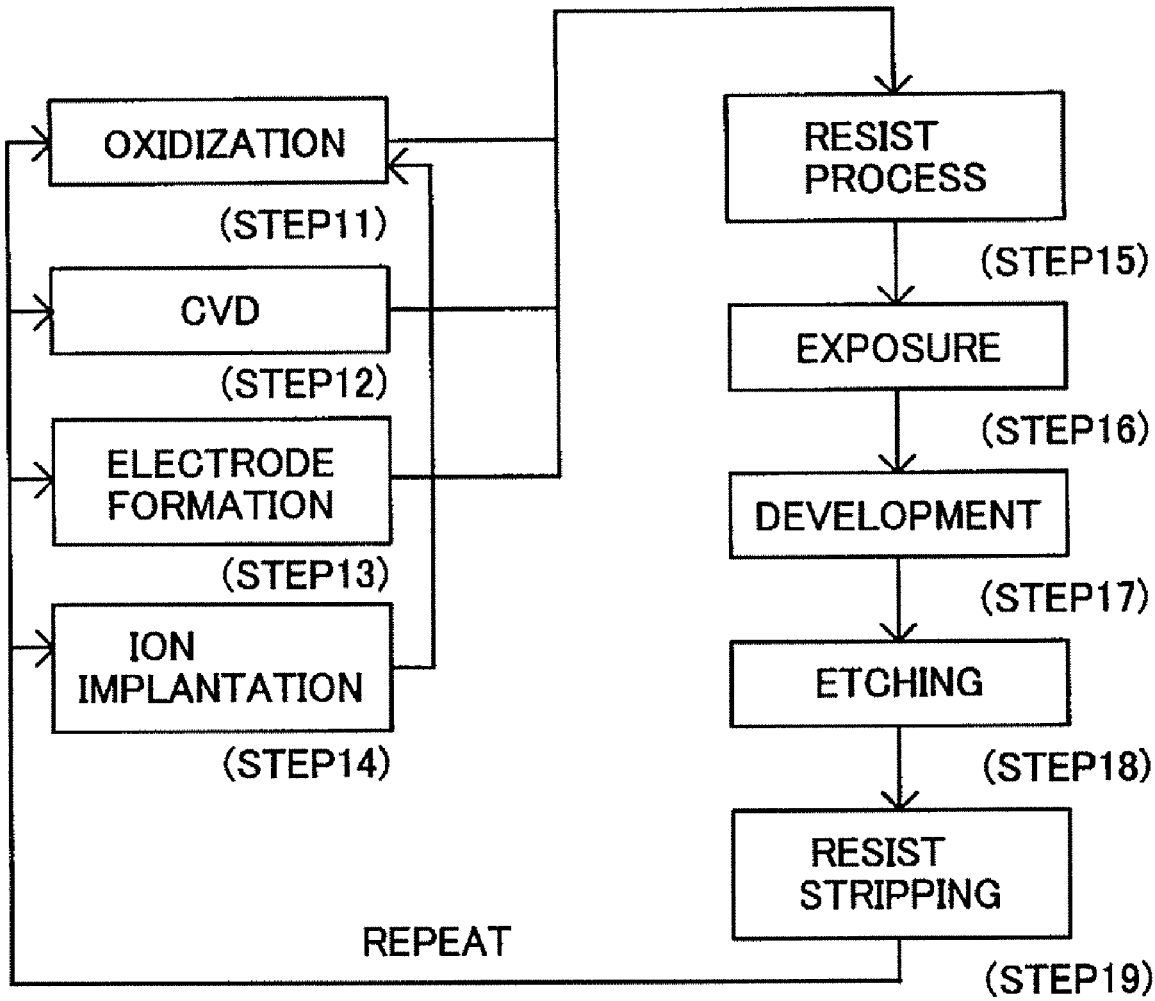
FIG. 13 is a detailed flowchart for a wafer process in step 4 shown in FIG. 12.

Referring to FIGS. 12 and 13, a description will now be given of an embodiment of a device manufacturing method using the above mentioned exposure apparatus 300. FIG. 12 is a flowchart for explaining how to fabricate devices (i.e., semiconductor chips such as IC and LSI, LCDs, CCDs). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms actual circuitry on the wafer through the photolithography of the present invention using the reticle and wafer. Step 5 (assembly), which is also referred to as a post-treatment, forms into a semiconductor chip the wafer formed in step 4 and includes a assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 300 to expose a circuit pattern of the reticle onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. The device fabrication method of this embodiment may manufacture higher quality devices than ever. Thus, the device manufacturing method using the exposure apparatus 300, and resultant devices constitute one aspect of the present invention.

Furthermore, the present invention is not limited to these preferred embodiments and various variations and modifications may be made without departing from the scope of the present invention. For example, this embodiment uses a projection optical system in the exposure apparatus for a target optical system, but the target optical system is not limited to the projection optical system in the exposure apparatus.

This application claims a foreign priority benefit based on Japanese Patent Application No. 2005-375946, filed on Dec. 27, 2005, which is hereby incorporated by reference herein in its entirety as if fully set forth herein.

What is claimed is:

1. A measurement apparatus for measuring an optical characteristic of a target optical system, said measurement apparatus comprising:
   an object side measurement mark having an object side slit located at an object side of the target optical system, the object side slit having a width in a shorter direction equal to or less than a diffraction limit of the target optical system;
   an image side measurement mark having a first image side slit located at an image side of the target optical system, and formed in the same direction as that of the object side slit, said image side measurement mark having a first image side slit that has, in a shorter direction, a width equal to or smaller than the diffraction limit of the target optical system, and a second image side slit that has, in a shorter direction, a width greater than the diffraction limit of the target optical system; and
   a detector for detecting an interference pattern formed by lights from said first and second image side slits,
   wherein the object side slit includes an object side 0° slit having a longer direction of 0°, an object side 45° slit having a longer direction of 45°, an object side 90° slit having a longer direction of 90° and an object side 135° slit having a longer direction of 135°, with respect to a reference direction,
   wherein said first image side slit includes an image side 0° slit having a longer direction of 0°, an image side 45° slit having a longer direction of 45°, an image side 90° slit having a longer direction of 90° and an image side 135° slit having a longer direction of 135°, with respect to the reference direction,
   wherein said measurement apparatus calculates a first wavefront based on a detecting result of an interference fringe formed by light from the image side 0° slit and said second image side slit and a detecting result of an interference fringe formed by light from the image side 90° slit and said second image side slit, and calculates a second wavefront based on a detecting result of an interference fringe formed by light from the image side 45° slit and said second image side slit and a detecting result of an interference fringe formed by light from the image side 135° slit and said second image side slit, and
   wherein said measurement apparatus calculates a wavefront of the target optical system based on the calculated first and second wavefronts.

2. An exposure apparatus for exposing a pattern of a reticle onto a substrate using a light from a light source, said exposure apparatus comprising:
   a projection optical system for projecting the pattern onto said substrate;
   a measurement apparatus according to claim 1 for measuring an optical characteristic of the projection optical system.

3. A measurement apparatus according to claim 1, wherein said measurement apparatus calculates a $\sin 2\theta$ component of the wavefront of the target optical system based on the calculated first wavefront, and
   wherein said measurement apparatus calculates a $\cos 2\theta$ component of the wavefront of the target optical system based on the calculated second wavefront.

4. A measurement apparatus according to claim 1, wherein said second image side slit includes an image side 0° slit having a longer direction of 0°, an image side 45° slit having a longer direction of 45°, an image side 90° slit having a longer direction of 90° and an image side 135° slit having a longer direction of 135°, with respect to the reference direction.

* * * * *